United States Patent
Maindron et al.

(10) Patent No.: US 9,082,999 B2
(45) Date of Patent: Jul. 14, 2015

(54) ORGANIC OPTOELECTRONIC DEVICE AND THE ENCAPSULATION METHOD THEREOF

(75) Inventors: Tony Maindron, Grenoble (FR); Bernard Aventurier, Saint Joseph de Riviere (FR); Jean-Yves Simon, Fontaine (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 14/111,009

(22) PCT Filed: Apr. 2, 2012

(86) PCT No.: PCT/IB2012/051605
§ 371 (c)(1),
(2), (4) Date: Jan. 15, 2014

(87) PCT Pub. No.: WO2012/140539
PCT Pub. Date: Oct. 18, 2012

(65) Prior Publication Data
US 2014/0124767 A1    May 8, 2014

(30) Foreign Application Priority Data
Apr. 11, 2011    (FR) ...................................... 11 53125

(51) Int. Cl.
*H01L 51/56*      (2006.01)
*H01L 51/52*      (2006.01)
(Continued)

(52) U.S. Cl.
CPC ........ *H01L 51/5253* (2013.01); *H01L 27/3246* (2013.01); *H01L 51/448* (2013.01); *H01L 51/5275* (2013.01); *H01L 51/56* (2013.01)

(58) Field of Classification Search
CPC .. H01L 51/56; H01L 51/5253; H01L 51/5275
USPC ........................................................ 257/40
See application file for complete search history.

(56) References Cited

U.S. PATENT DOCUMENTS 7,781,967 B2 *   8/2010  Hayashi ........................ 313/512
2011/0031514 A1  2/2011  Sakaguchi et al.
(Continued)

FOREIGN PATENT DOCUMENTS

| FR | 2 936 651 A1 | 4/2010 |
| FR | 2 958 795 A1 | 10/2011 |
| JP | 2005-353500 A | 12/2005 |

OTHER PUBLICATIONS

Patel, N. K., et al.; "*High-efficiency organic light-emitting diodes;*" IEEE Journal of Selected Topics in Quantum Electronics, vol. 8, No. 2; pp. 346-361; dated 2002; abstract retrieved on Jan. 14, 2014 from <http://ieeexplore.ieee.org/xpl/freeabs_all.jsp?arnumber=999190&abstractAccess=no&userType=inst>.
(Continued)

*Primary Examiner* — Tran Tran
(74) *Attorney, Agent, or Firm* — Alston & Bird LLP

(57) ABSTRACT

An organic optoelectronic device incorporating a hermetic thin-film encapsulation, and encapsulation method are provided. This device has a useful emission or absorption face and, behind this face, a substrate coated with an array of radiation-emitting or radiation-absorbing organic structures inserted between, and electrically contacting, electrodes that are respectively proximal and distal relative to the substrate. Separating beads between structures, composed of an insulating material, extend between the respective proximal electrodes of the structures from peripheral edges of these electrodes. The device includes a hermetic encapsulation that has at least one inorganic internal film surmounting the distal electrode, a photosensitive polymer layer covering this internal film, and a dielectric inorganic external film acting as a barrier covering the polymer layer. The polymer layer is etched with a discontinuous geometry formed of segments that respectively surmount the structures and end beyond the structures in line with the beads.

14 Claims, 2 Drawing Sheets

(51) Int. Cl.
*H01L 27/32* (2006.01)
*H01L 51/44* (2006.01)

(56) References Cited

U.S. PATENT DOCUMENTS

2011/0198627 A1 8/2011 Maindron et al.
2013/0049580 A1 2/2013 Maindron et al.

OTHER PUBLICATIONS

International Preliminary Report for Application No. PCT/IB2012/051605; dated Jun. 24, 2013.
International Search Report and Written Opinion for Application No. PCT/IB2012/051605; Dated Jun. 20, 2012.

* cited by examiner

ORGANIC OPTOELECTRONIC DEVICE AND THE ENCAPSULATION METHOD THEREOF

FIELD

The present invention relates to an organic optoelectronic device, such as a display, illuminating or signaling device that is protected from the ambient atmosphere by an airtight encapsulation of the type comprising thin films, and to a process for encapsulating such a device. The invention especially applies to devices comprising organic light-emitting diodes (OLEDs), such as AMOLED (i.e. active matrix OLED) displays whatever their size, or such as devices for extracting light by refraction.

BACKGROUND

As is known, organic optoelectronic devices such as OLEDs, devices comprising organic photovoltaic cells (OPVCs) and those comprising organic transistors (TFTs) need to be encapsulated in order to protect their sensitive components from gaseous species in the atmosphere (mainly oxygen and water vapor). Specifically, if this protection is not provided there is a risk that the device will subsequently degrade, which degradation manifests itself mainly via the appearance of dark black spots in the case of OLEDs, which spots are in fact the result of the penetration of water vapor into the diode, which penetration degrades the interface between the cathode (or anode) and the organic film or films.

This encapsulation may typically be achieved using a glass cap that is adhesively bonded to the organic device using a specific adhesive, especially one having a low water permeability. A solid moisture absorber or getter is generally added between the substrate and the cap in order to prolong the lifetime of the device.

For certain applications, but also in order to reduce cost, thin inorganic barrier films have been developed, the role of which, analogously to that of the cap/getter assembly, is to protect the underlying device from attack by moisture. Generally, these barrier layers are oxides (such as preferably $Al_2O_3$) nitrides or oxynitrides, or in certain cases they may be thin metal films, except if the light-emitting unit emits via the top of its structure (i.e. top emission) in which case the barrier layers must be transparent.

These thin films are deposited by standard vacuum deposition processes such as chemical vapor deposition (CVD), which is optionally plasma enhanced (PECVD), atomic layer deposition (ALD, sometimes called ALCVD), or by physical vapor deposition (PVD) processes including evaporation and sputtering. For the barrier layer, CVD and, in particular, ALD technologies are preferred, which technologies, at low temperatures, give dense barrier layers with few defects (pinholes), these layers being 100% conformal at temperatures most frequently below 110° C. i.e. at temperatures compatible with OLEDs. Thus, at low temperatures a defect density as low as $38/cm^2$ has been demonstrated in an $Al_2O_3$ layer deposited by ALD. For microdisplay applications, this defect density is nevertheless too high because, for a microdisplay area of $45 mm^2$ this would lead to 17 defects per microdisplay, i.e. to potentially 17 dark spots in the OLED display. Specifically, even though these dark spots intrinsic to the fabrication process are microscopic, their presence is prohibitive in an OLED device the image of which is magnified by suitable optics, and it is furthermore necessary to add the "extrinsic" dark spots due to the presence of undesirable particles present on the surface of the device when it is encapsulated in these thin films.

Moreover, it is known that it is necessary to protect ALD-deposited $Al_2O_3$ from water over the long term because it has a tendency to hydrolyze into $Al(OH)_x$. It has therefore been sought to durably passivate the barrier formed by such an $Al_2O_3$ film using more chemically inert and stabler inorganic material such as $SiO_2$, $Si_3N_4$ or $SiO_xN_y$, via deposits produced by low-temperature PECVD, which deposits also allow the residual defects in these $Al_2O_3$ films to be filled.

As a variant, it has been sought to passivate these ALD-deposited $Al_2O_3$ films with a number of relatively thick planarizing polymer-based organic layers, which layers are intended to remedy the drawback of the aforementioned undesirable particles by coating them with a multilayer of alternating organic and inorganic layers, in the manner of the Vitex Barix™ multilayer. One drawback of this solution lies in the "flash" gas-phase evaporation process used (i.e. the monomer is evaporated, condensed on the substrate, and then exposed to UV in order to cross link it) which process is relatively costly in time.

It is difficult to envision using other less time-costly types of deposition, such as liquid phase deposition, because this type of deposition requires the use of polymer solutions, these solutions containing solvents that are liable to dissolve the layers of the underlying light-emitting unit.

The patent application FR 10 01522 filed 12 Apr. 2010 in the name of the Applicant discloses an organic optoelectronic device, for example an OLED, that remedies these drawbacks, this device comprising a light-emitting unit comprising an active zone coated with an airtight multilayer encapsulation structure and an adjacent electrical connection zone, the encapsulation structure comprising at least one inorganic film multilayer F1/photoresist layer C1 where the film F1 covers the active zone and is surmounted by the layer C1, which layer C1 is deposited in liquid phase, etched by photolithography and covers the film F1 while extending around the active zone in a structured enveloping portion that terminates short of the connection zone, hence the layer C1 passivates the film F1 and provides the active zone with lateral protection from the solvents and developer solutions used to etch the layer C1. The latter is advantageously covered with an external inorganic barrier film Fe that surmounts both the active zone, while completely covering the layer C1, and its connection zone, so as to isolate from the exterior the enveloping portion of the layer C1.

This patent application also mentions the possibility of carrying out, after the enveloping resist layer has been developed, dry etching of this layer, for example reactive ion etching (RIE) or etching in an oxygen plasma, in order to decrease its thickness and therefore the total thickness of the multilayer, and thus meet the specifications of microdisplays in respect of crosstalk (i.e. in order to prevent emission from neighboring pixels overlapping when color filters are used).

The Applicant has observed that in certain cases, for example for large display sizes, or following certain heat treatments, blisters may appear on the surface of the external film covering the resist (see FIG. 1, appended to the present description). These blisters seem to increase in number as the volume of the underlying resist increases. The appearance of blisters therefore seems to be related to a resist degassing effect. To mitigate this drawback the resist may be thinned (in order to decrease the total volume thereof) for example by using a plasma.

However, one drawback of this solution consisting in thinning the photoresist to a significant degree in order to prevent this blistering, lies in the risk that results therefrom that thickness uniformity will be penalized between the edges and the center of the device and at the integrated-circuit scale (because of nonuniformity between the edges and center). This risk is all the more marked the larger the size of the device. In addition, the barrier properties of the encapsulation may be penalized by such thinning of the resist.

SUMMARY

One aim of the present invention is to provide an organic optoelectronic device, such as an OLED or OPVC type display, illuminating or signaling device, that allows all of the aforementioned drawbacks to be remedied, in particular by preventing this blistering effect and by providing for the encapsulation an alternative solution to thinning, this device comprising a useful face (i.e. the light-emitting face for OLEDs or the absorbing face for OPVCs) and, toward the interior of this face, a substrate coated with a matrix of n organic structures (which emit radiation in the case of OLEDs or absorb it in the case of OPVCs) intermediate between and making electrical contact with electrodes that are proximal and distal with respect to the substrate, respectively, separating beads being placed between the organic structures, these beads being made of an electrical insulator (e.g. a resist or an oxide or nitride film) and extending between the respective proximal electrodes of these structures from peripheral edges of the proximal electrodes, the device comprising a thin-film-comprising airtight encapsulation, which comprises at least:
  one internal inorganic film surmounting the distal electrode;
  one photosensitive polymer layer covering this internal film; and
  one external inorganic dielectric barrier film covering this polymer layer.

For this purpose, a device according to the invention is such that said at least one polymer layer is etched with a discontinuous geometry formed from n pads that respectively surmount these n organic structures, and that terminate beyond the latter in line with said beads, so that pairwise adjacent pads are spaced apart by a distance less than the width of the beads.

It will be noted that, in contrast to the encapsulation obtained in the aforementioned patent application which is at the scale of the active zone, an encapsulation is obtained at the scale of each emitting or absorbing organic structure (which is, for example, in the case of a display, a pixel or a subpixel, as explained below), and that using pads having a discontinuous geometrical form for the or each photosensitive layer allows the total volume of this layer, which is covered by the external barrier film, to be significantly decreased because of the free space between the pads, thus making it easier to degas the photosensitive layer following its deposition and before that of the external film, thereby making it possible to minimize the risk that blisters will appear on the surface of this external film even under high-temperature annealing or ageing conditions (possibly at 85° C. or above).

It will also be noted that this etched structure of the or each photosensitive layer may be obtained with precision by photolithography, i.e. by locally exposing the photosensitive layer by means of a mask, and by developing this layer, this etching allowing these pads to be structured and therefore formed with precision.

According to another feature of the invention, each of said pads protrudes beyond the organic structure on which said pad is centered by a protruding peripheral portion, which has a width less than the half-width of the corresponding bead.

Advantageously, the developed surface area of all of said pads (corresponding to the exchange surface area through which degassing takes place) is greater than the external surface area that said at least one polymer layer would have had if it continuously covered said at least one internal film with a height equal to that of said pads.

According to one embodiment of the invention, said pads are based on a positive photoresist that is deposited in liquid phase, in the form of at least one polymer dissolved in a solvent, this resist preferably being a "TELR" resist. The expression "positive resist" is, as is known, understood to mean a resist that polymerizes on deposition, the parts selectively exposed to UV radiation through a mask being depolymerized then dissolved during development. As a variant, this resist may be a negative resist (i.e. by definition its exposed regions polymerize, these regions thus becoming insoluble in the developer and remaining in place in the final multilayer).

According to another feature of the invention, said pads may be 1 µm or more in height.

Advantageously, said at least one internal film and/or said at least one external film may be deposited by ALD or PECVD, and be based on at least one inorganic compound chosen from the group consisting of compounds of formula $Al_xO_y$, $SiO_x$, $Si_xN_y$, $SiO_xN_y$, ZnSe, $Sb_2O_3$ and the transparent conductive oxides (TCOs), optionally combined with a metal.

Also advantageously, said at least one internal and/or external film may be deposited by ALD and be based on at least one aluminum oxide $Al_2O_3$, optionally combined with a compound of formula $SiO_x$, $Si_xN_y$ or $SiO_xN_y$.

Advantageously, a device according to the invention may be an AMOLED device (i.e. an active matrix light-emitting diode). This AMOLED device may advantageously be a display in which said organic emitting structures respectively form pixels or subpixels, this display for example being a color display in which each pixel is defined by R, G, B subpixels that are respectively formed by said emitting structures surmounted by said pads.

As a variant, this AMOLED device may be a device from which light is extracted by refraction, said pads of this device then forming as many diopters between a first medium formed by said polymer layer and a second, for example less refringent, medium external to the device. These pads may in this case have convex external faces in the manner of lenses, covered with corresponding corrugations of said external film.

Such a display-type device may be covered with a protective sheet (for example one made of glass or plastic) that is provided with optical R, G, B color filters on its internal face, which filters are placed facing corresponding subpixels of each pixel, this cap being joined under pressure to the device using a UV curable adhesive (preferably an acrylate or an epoxy). As a variant, the filters may be produced directly on the encapsulation layers of the device.

As a variant, the pixels of the matrix might not be individually addressed, as in the case of an AMOLED device, in order to form an illuminating panel, for example.

An encapsulation process according to the invention for encapsulating a device such as defined above comprises the following steps in succession:
  a) said internal inorganic film is deposited over said organic structures and said beads, for example directly on said distal electrode, by atomic layer deposition (ALD) or else by plasma enhanced chemical vapor deposition (PECVD), this film being based on at least one inorganic compound preferably chosen from the group consisting of compounds of formula $Al_xO_y$, $SiO_x$, $Si_xN_y$, $SiO_xN_y$, ZnSe, $Sb_2O_3$ and the transparent conductive oxides (TCOs), optionally combined with a metal;

b) this internal film is continuously covered with the photosensitive layer, which is deposited in liquid phase, in the form of at least one polymer dissolved in a solvent, an adhesion promoter, for example of the silane type, optionally being deposited beforehand on this film;

c) this layer is exposed in preset locations by selectively masking it from exposing radiation so that it is, on the one hand, following this exposure, polymerized above each organic structure and in the protruding peripheral portion of each organic structure terminating in line with said surrounding bead, and on the other hand, depolymerized elsewhere, so as to form said spaced pads respectively surmounting the organic structures and coating them in order to protect them in step d);

d) this polymerized layer is developed by dipping in a bath, for example a bath of tetramethyl ammonium hydroxide; and then e) said external barrier film is deposited in the form of a layer continuously covering the pads by conformal low-temperature deposition, this conformal deposition preferably being carried out by atomic layer deposition (ALD) or plasma enhanced chemical vapor deposition (PECVD) of at least one dielectric compound.

Advantageously, a step of thinning said photosensitive layer may be carried out before step c) and/or after step d).

Also advantageously, a heat treatment step may be carried out, after step d) or after step e), at a temperature that is compatible with the temperature withstand of the organic material, and that may be comprised between 60° C. and 100° C., in order to degas said photosensitive layer.

It will be noted that steps a) and e) are preferably carried out by ALD, it being possible, using this technique, to deposit a high-density film with a very low permeability at a low temperature, this film following as closely as possible the micro or nanoreliefs in the underlying surface.

It will also be noted that this internal film, deposited by ALD, allows polar or nonpolar solvents e.g. ethanol, water, acetone and photoresist developers/strippers such as those denoted TMAH and ROR.

As for step b), it may be carried out using any coating technique, for example by spin coating or by dip coating.

Preferably, a positive photolithography resist is used by way of photosensitive polymer and, in step c), the photosensitive layer surmounting each organic structure is selectively masked by means of a mask that extends beyond said structure so that this layer is protected thereby from exposure, this layer, as a result, remaining polymerized, in contrast to the rest of this layer which is depolymerized by this exposure with a view to dissolving it.

BRIEF DESCRIPTION OF THE DRAWINGS

Other advantages, features and details of the invention will become apparent from the rest of the description that follows, given with reference to the appended drawings that are provided merely by way of example, and in which.

DETAILED DESCRIPTION

The multilayer encapsulation 1, 1' illustrated in these figures for example covers the external emitting face of a light-emitting optoelectronic device 2, 2' the sensitive components of which are to be protected from moisture and oxygen in the ambient air.

Figure 5:
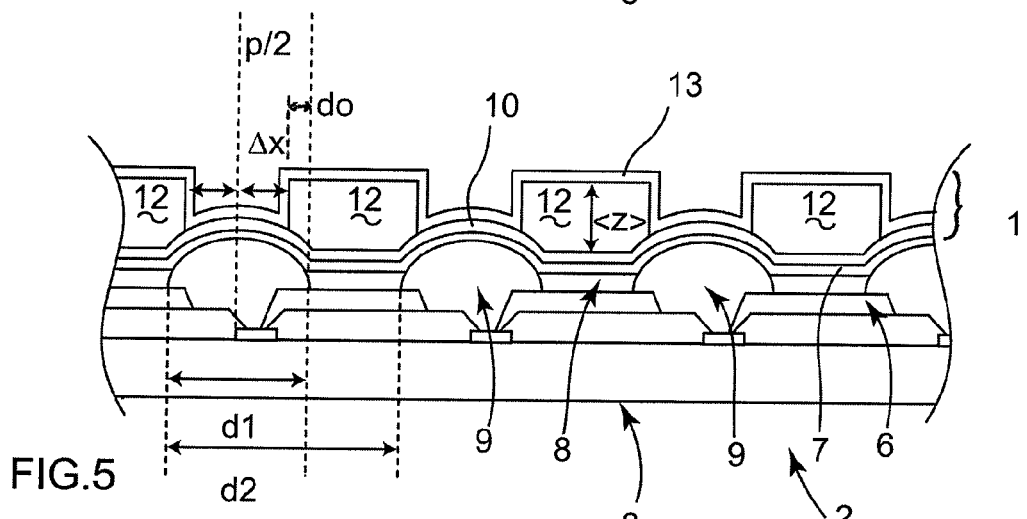
FIG. 5 is a schematic cross-sectional view of a device according to the invention showing the result of the aforementioned step e) of its fabrication process, in which device the external barrier film covers the photoresist pads in FIG. 4.
Figure 6:
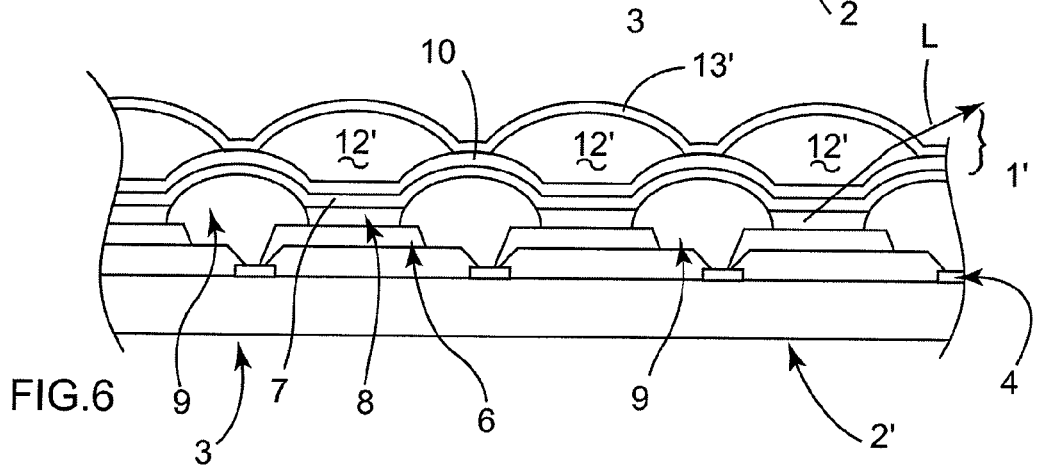
FIG. 6 is a schematic cross-sectional view of another device according to a variant of the invention, which device enables extraction of light by refraction via its photoresist pads, which pads form as many diopters between a first medium formed by these pads and a second medium external to the device.

The optoelectronic devices 2 and 2' illustrated in FIGS. 5 and 6, respectively, are each for example OLEDs, comprising, as is known, a substrate 3, typically made of silicon, coated with a light-emitting unit 4, defining an active zone and an adjacent electrical connection zone (not shown). The light-emitting unit 4 comprises internal electrodes 6 and external electrodes 7 between which light-emitting structures 8 are interposed (see FIG. 2, forming for example pixels or even subpixels in the particular case of displays), at least one of the electrodes (in this example the external electrode 7, i.e. possibly the cathode) being transparent or semitransparent to the light emitted in order to allow it to radiate from the active zone to the exterior of the device 2, 2'.

The external electrode 7 is preferably made of a metal such as silver, aluminum or samarium because of the transparency properties of these metals in the visible domain and of their electrical conductivity at small thicknesses (the external electrode 7 is for example between 10 nm and 30 nm in thickness). Each OLED emitting structure 8 consists, for example, of a multilayer of organic films designed to transfer electrons and holes from the electrodes, these electrons and holes being recombined to generate excitons and therefore light emission.

As is also known, separating beads 9 made of an electrical insulator (e.g. of an electrically insulating resist or resin or of an oxide or nitride) separate pairwise adjacent emitting structures 8 by extending from respective peripheral edges of the internal electrodes 6.

As may especially be seen in FIGS. 5 and 6, the multilayer encapsulation 1 according to these embodiments of the invention comprises:

an internal inorganic "pre-encapsulation" film 10 that is preferably deposited by ALD over all of the active zone of the OLED unit 4, and which is, for example, based on an $Al_2O_3$ oxide deposited with a thickness comprised between 5 nm and 50 nm, typically between 10 nm and 25 nm;

n pads 12, 12' based on a photoresist R, for example either of the positive resists denominated TELR-P002 and JSR420, which pads cover these n emitting structures 8, respectively, and terminate beyond the latter in line with the beads 9 so that pairwise adjacent pads 12, 12' are spaced apart by a distance $2\Delta x$ less than the width $d_1$ of the beads 9 ($d_1$ being measured in the transverse direction in FIGS. 4 and 5); and an external inorganic dielectric barrier film 13, 13' (which may be seen in FIGS. 5 and 6) that continuously and completely covers the faces of the pads 12, 12', the parts of the film 10 not covered by these pads 12, 12', and the electrical connection zone of the unit 4, this film 13, 13' preferably being based on ALD-deposited $Al_2O_3$.

More precisely, with reference to the device 2 in FIG. 5, first the internal film 10 is deposited on the external electrode 7 or on an additional layer that is commonly called the capping layer and that may advantageously have been deposited beforehand on the external electrode 7 (this index-rupturing layer serves to improve the light extraction coefficient of the OLED emitting structure, and it may for example be an $SiO_x$ layer evaporated through a display-size stencil in a similar way to the external electrode 7). As may be seen in FIG. 2, this film 10 here closely follows in alternation the rounded shape of the beads 9 and the flat shape of the emitting structures 8 that are separated by these beads 9.

Figure 1:
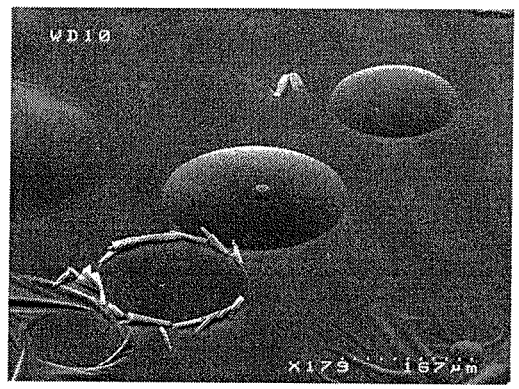
FIG. 1 is a scanning electron microscope (SEM) micrograph of an OLED display device showing blisters that appeared in an external barrier film made of $Al_2O_3$ deposited on a TELR photoresist shaped according to the prior art after storage in an air-conditioned chamber.
Figure 2:
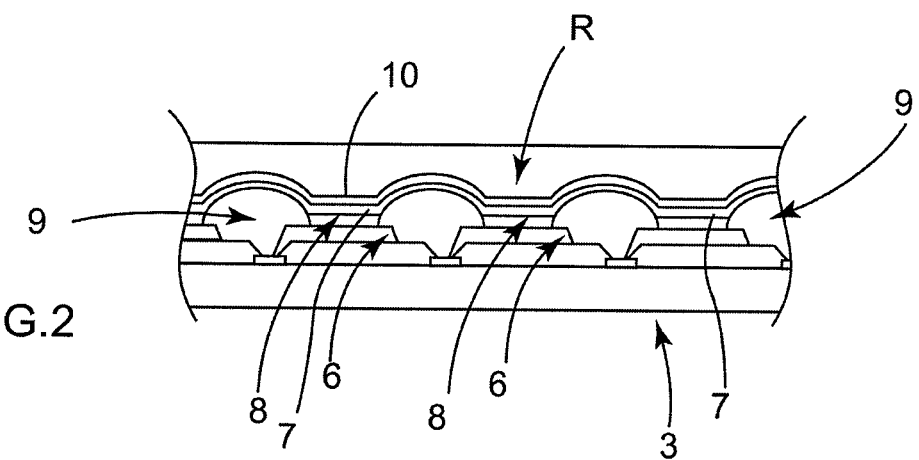
FIG. 2 is a schematic cross-sectional view of a device according to the invention showing the result of the aforementioned step b) of its fabrication process, with an internal inorganic film covered with a photosensitive layer deposited by wet processing.

Next, as may be seen in FIG. 2, the photoresist R is deposited by wet processing (for example by spin coating) on the internal film 10, the photoresist R dissolved in a solvent so that it continuously covers the film 10. It is possible at this stage to thin this resist R.

Figure 3:
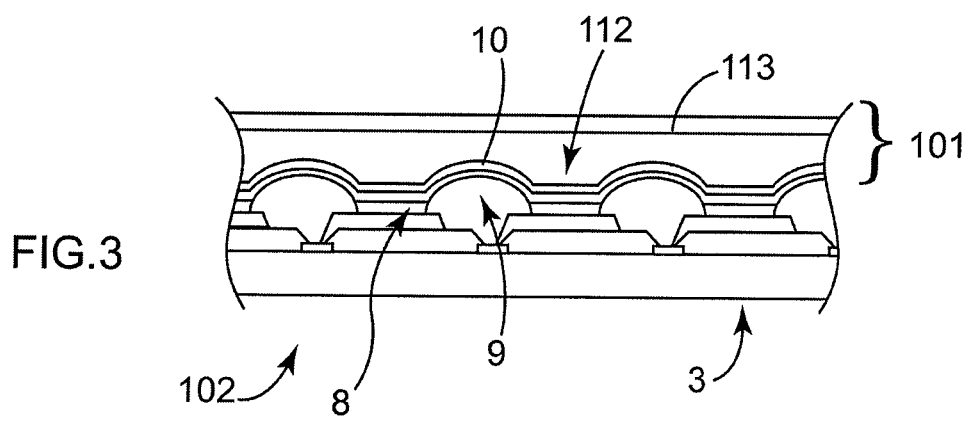
FIG. 3 is a schematic cross-sectional view of a device not according to the invention in which the external barrier film covers the photosensitive layer, the photosensitive layer continuously surmounting all of the emitting structures of the device.

However, in contrast to the encapsulation 101 not according to the invention in FIG. 3, in which encapsulation the external inorganic dielectric barrier film 113 covers a flat and continuous external face of the polymerized and developed photoresist 112, the encapsulation 2 in FIG. 5 comprises, by way of a photosensitive polymer layer, a discontinuous layer 12 (see FIG. 4), which discontinuous layer 12 is obtained by:

exposing the resist R in preset locations by selectively masking it from exposing radiation so that it is polymerized above each emitting structure 8 and in a peripheral portion $d_0$ protruding beyond each structure 8 and terminating in line with the bead 9 surrounding it, and depolymerized elsewhere, thereby forming pads 12 spaced apart from each other by a distance $2\Delta x$, these pads respectively surmounting the structures 8 and coating them in order to protect them during the developing step; then by developing the polymerized resist R thus exposed by dipping in a bath (e.g. of tetramethylammonium hydroxide).

It is possible to thin the pads 12 of resist R at this stage.

As for the external film 13 covering these pads 12, FIG. 5 shows that, in this embodiment, it closely follows the profile of the flat tops and the equally flat flanks of these pads 12, these flanks or lateral faces here lying substantially perpendicular to the top of each pad 12. However, it will be noted that it would be possible as a variant, without departing from the scope of the present invention, for each pad to have a top and/or flanks with geometries other than those in FIG. 4, such as, for example, flanks that are at least partially inclined with respect to the direction perpendicular to the top, which could have a curved shape (see the device 2' in FIG. 6).

Figure 4:
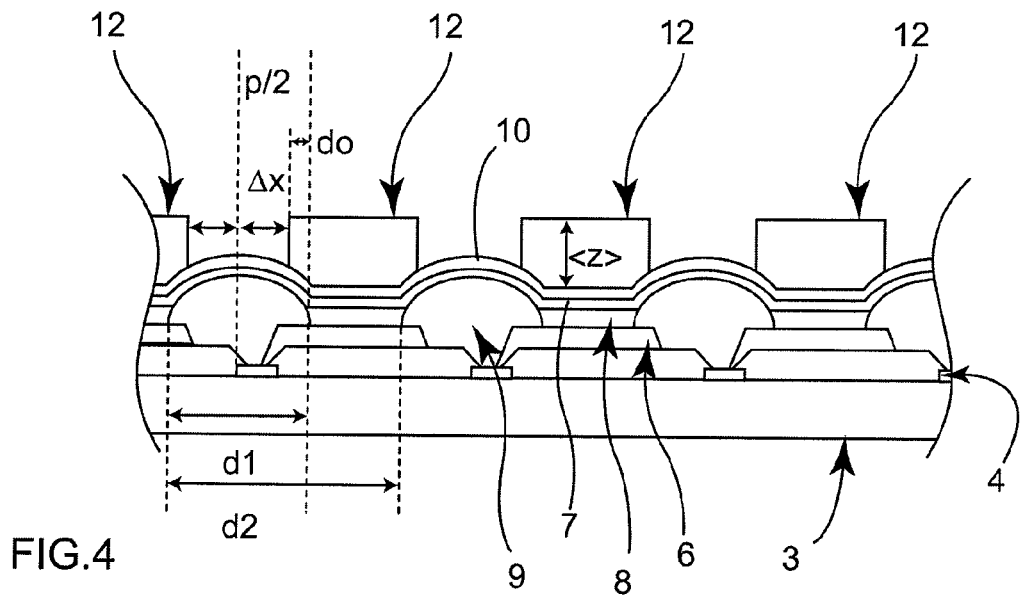
FIG. 4 is a schematic cross-sectional view of a device according to the invention showing the result of the aforementioned step d) of its fabrication process, showing the photosensitive layer deposited in FIG. 2 structured to form spaced pads surmounting the emitting structures of the device, respectively.

As may be seen in FIG. 4, a peripheral protruding portion of each of said pads 12 protrudes beyond the organic structure 8 on which said pad is centered, which peripheral portion has a width smaller than the half-width $d_1/2$ of the bead 9 (this half-width is also identified by the half-pitch p/2) and, in this example, smaller than quarter $d_1/4$ of the width of this bead 9. If the pitch $d_2$ between two consecutive beads 9 is considered, it may be seen that the volume of photoresist R used for the pads 12, over this length $d_2$ and for pads 12 of a given height $<z>$, is:

$V=(d_2-2\Delta x)\cdot<z>$ (this is a volume per unit length in the other horizontal direction y perpendicular to the x- and z-directions).

Whereas in the case in FIG. 3, $\Delta x=0$ and therefore this volume $V=d_2\cdot<z>$ (again per unit length in the y-direction), with the present invention the relationship $0<\Delta x<d_1/2$ is obtained, such that the photoresist R of each pad 12 perfectly covers the area of the corresponding emitting structure 8 (i.e. the area of each pixel in the case of the display), while surmounting a minimum area of the bead 9, this minimum area being defined by the protruding portion $d_0$.

The Applicant has produced AMOLED displays according to FIG. 5 with $d_1=1.569$ μm and $d_2=5.098$ μm, with each time a necessary condition for the protruding portion $d_0$ of each pad 12 being that it be less than $d_1/2$ in width, i.e. $d_0<0.784$ μm.

By way of comparison with a display 102 according to FIG. 3, i.e. not according to the invention, in which a single photosensitive pad 112 surmounts the entire active zone, i.e. an area of enveloping about 5×5 μm², the spaced-apart photosensitive pads 12 of the device 2 according to the invention each only surmount one pixel of the active zone of the display, thereby defining for the layer of photoresist R, a total enveloping area of only 3.5×3.5 μm². It is therefore possible, using the device 2 of the invention, to remove about 25% of the photoresist at the display-scale, and therefore significantly improve degassing from this resist before deposition of the external barrier film 13. Specifically, and as explained above, the amount of degassing required is decreased by decreasing the amount of photoresist R before degassing, and this degassing is also facilitated by the surface area freed between the pads 12 of resist.

For large areas, the reduction in the area of the photoresist R used will be noted to permit effective degassing of this resist after it has been deposited, at temperatures acceptable to the underlying OLED unit 4.

The device 2' according to the variant in FIG. 6 is also for example an AMOLED device, but its pads 12' form as many diopters for improving extraction of the light emitted by the structures 8 because these pads 12' are shaped to form convex lenses in order to improve the output coupling coefficient. More precisely, FIG. 6 shows that each of these pads 12' has flanks and a top that together form a continuous convex external surface. As for the external inorganic barrier film 13' that covers these pads 12', it contains, on the one hand, short recessed convex zones Z1 that closely follow the respective tops of the internal film 10 (i.e. in line with the tops of the beads 9) and, on the other hand, long top zones Z2 that are also convex and that surmount and protrude beyond the emitting structures 8.

In this application, the indices of the media must however be considered, with, for example, the refractive index of these pads 12' being set to 1.5, the refractive index of the medium external to the device 2' being equal to 1. The path L of light emitted and then refracted by a structure 8 is schematically shown in FIG. 6. The reader may for example refer to the article High-Efficiency Organic Light-Emitting Diodes, Patel, N. K, Cina, S. and Burroughes, J. H., IEEE Jour. Sel. Topics Quant. Elec. 8 (2002) 346-361 for a description of the operation of such a light-extracting device having an improved output coupling coefficient.

The invention claimed is:

1. An organic optoelectronic device comprising organic light-emitting diodes (OLEDs) or organic photovoltaic cells (OPVCs), this device comprising a useful emission or absorption face and, toward the interior of this face, a substrate coated with a matrix of n organic radiation-emitting or radiation-absorbing structures inserted between and making electrical contact with electrodes that are proximal and distal with respect to the substrate, respectively, separating beads being placed between the organic structures, these beads being made of an electrical insulator and extending between the respective proximal electrodes of the structures from peripheral edges of these proximal electrodes, the device comprising a thin-film-comprising airtight encapsulation, which comprises at least:
   one internal inorganic film surmounting the distal electrode;
   one photosensitive polymer layer covering this internal film; and
   one external inorganic dielectric barrier film covering this polymer layer,
   wherein said at least one polymer layer is etched with a discontinuous geometry formed from n pads that respectively surmount these n organic structures, and that terminate beyond the latter in line with said beads, so that pairwise adjacent pads are spaced apart by a distance less than the width ($d_1$) of the beads, each pad having a top and flanks that lie substantially perpendicular to said top.

2. The device as claimed in claim 1, wherein said top and said flanks of each of said pads are flat, each pad being 1 μm or more in height.

3. The device as claimed in claim 1, wherein a peripheral protruding portion of each of said pads protrudes beyond the organic structure on which said pad is centered, which peripheral portion has a width ($d_0$) less than half the width ($d_1$) of said corresponding bead.

4. The device as claimed in claim 1, wherein the developed surface area of all of said pads is greater than the external surface area that said at least one polymer layer would have had if it continuously covered said at least one internal film with a height (z) equal to that of said pads.

5. The device as claimed in claim 1, wherein said pads are based on a positive photoresist that is deposited in liquid phase, in the form of at least one polymer dissolved in a solvent.

6. The device as claimed in claim 1, wherein said at least one internal film and/or said at least one external film is/are deposited by atomic layer deposition (ALD) or else by plasma enhanced chemical vapor deposition (PECVD), and are based on at least one inorganic compound chosen from the group consisting of compounds of formula $Al_xO_y$, $SiO_x$, $Si_xN_y$, $SiO_xN_y$, ZnSe, $Sb_2O_3$ and the transparent conductive oxides (TCOs), optionally combined with a metal.

7. The device as claimed in claim 6, wherein said at least one internal film and/or said at least one external film is/are deposited by ALD and are based on at least one aluminum oxide $Al_2O_3$, optionally combined with a compound of formula $SiO_x$, $Si_xN_y$ or $SiO_xN_y$.

8. The device as claimed in claim 1, wherein the device is an active matrix organic light-emitting diode or AMOLED.

9. The device as claimed in claim 8, wherein the device is a display in which said organic emitting structures respectively form pixels or subpixels.

10. The device as claimed in claim 9, wherein the device is a color display in which each pixel is defined by R, G, B subpixels that are respectively formed by said organic emitting structures surmounted by said pads.

11. A process for encapsulating a device according to claim 1, wherein the device comprises the following steps in succession:
   a) said internal inorganic film is deposited over said organic structures and said beads, for example directly on said distal electrode, by atomic layer deposition (ALD) or even by plasma enhanced chemical vapor deposition (PECVD), this film being based on at least one inorganic compound preferably chosen from the group consisting of compounds of formula $Al_xO_y$, $SiO_x$, $Si_xN_y$, $SiO_xN_y$, ZnSe, $Sb_2O_3$ and the transparent conductive oxides (TCOs), optionally combined with a metal;
   b) this internal film is continuously covered with said photosensitive layer (R), which is deposited, for example by spin coating, in liquid phase, in the form of at least one polymer dissolved in a solvent, an adhesion promoter, for example of this silane type, optionally being deposited beforehand on this film;
   c) this layer is exposed in preset locations by selectively masking it from exposing radiation so that it is, firstly, following this exposure, polymerized above each organic structure and in a protruding peripheral portion ($d_0$) of each organic structure terminating in line with said surrounding bead, and secondly, depolymerized elsewhere, so as to form said spaced pads respectively surmounting the organic structures and coating them in order to protect them in step d);
   d) this polymerized layer is developed by dipping in a bath, for example a bath of tetramethyl ammonium hydroxide; and then
   e) said external barrier film is deposited in the form of a layer continuously covering said pads by conformal low-temperature deposition, this conformal deposition preferably being carried out by atomic layer deposition (ALD) or plasma enhanced chemical vapor deposition (PECVD) of at least one dielectric compound.

12. The encapsulation process as claimed in claim 11, wherein a step of thinning said photosensitive layer is carried out before step c) and/or after step d).

13. The encapsulation process as claimed in claim 11, wherein a heat treatment step is carried out, after step d) or after step e), at a temperature that is compatible with the temperature withstand of the organic material, and that may be comprised between 60° C. and 100° C., in order to facilitate the degassing of said photosensitive layer.

14. The device as claimed in claim 1, wherein said pads are based on a positive photoresist that is deposited in liquid phase, in the form of at least one polymer dissolved in a solvent, and wherein said resist is a "TELR" resist.

* * * * *